United States Patent
Shirono et al.

(10) Patent No.: US 8,748,316 B2
(45) Date of Patent: Jun. 10, 2014

(54) METHOD OF MANUFACTURING SEMICONDUCTOR DEVICE, SEMICONDUCTOR DEVICE, AND CAMERA MODULE

(75) Inventors: Takashi Shirono, Tokyo (JP); Mie Matsuo, Kanagawa (JP); Hideo Numata, Oita (JP); Kazumasa Tanida, Oita (JP); Tsuyoshi Matsumura, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 206 days.

(21) Appl. No.: 13/169,548

(22) Filed: Jun. 27, 2011

(65) Prior Publication Data

US 2011/0317050 A1 Dec. 29, 2011

(30) Foreign Application Priority Data

Jun. 28, 2010 (JP) ................................. 2010-145886

(51) Int. Cl.
*H01L 21/302* (2006.01)
*H01L 21/461* (2006.01)

(52) U.S. Cl.
USPC ............................ 438/690; 438/692; 438/745

(58) Field of Classification Search
USPC ................ 438/455, 459, 693, 691, 692, 759; 451/28, 29, 31; 216/52, 89; 257/E21.088, E21.087
See application file for complete search history.

(56) References Cited

U.S. PATENT DOCUMENTS

| 5,426,073 | A | 6/1995 | Imaoka et al. | |
|---|---|---|---|---|
| 6,583,029 | B2 | 6/2003 | Abe et al. | |
| 7,122,095 | B2 * | 10/2006 | Letertre et al. | 156/701 |
| 7,404,870 | B2 * | 7/2008 | Letertre et al. | 156/257 |
| 7,859,073 | B2 | 12/2010 | Matsuo et al. | |
| 7,989,907 | B2 | 8/2011 | Inoue | |
| 8,093,687 | B2 * | 1/2012 | Letertre et al. | 257/618 |
| 8,288,710 | B2 | 10/2012 | Tsukamoto et al. | |
| 2003/0008478 | A1 | 1/2003 | Abe et al. | |
| 2009/0117707 | A1 | 5/2009 | Shimomura et al. | |
| 2009/0295979 | A1 | 12/2009 | Matsuo et al. | |
| 2010/0019134 | A1 | 1/2010 | Tsukamoto et al. | |
| 2010/0096677 | A1 | 4/2010 | Inoue | |
| 2010/0255682 | A1 * | 10/2010 | Trickett et al. | 438/692 |
| 2011/0073983 | A1 | 3/2011 | Tanida et al. | |

FOREIGN PATENT DOCUMENTS

| JP | 2000-252354 | 9/2000 |
|---|---|---|
| JP | 2000-340544 | 12/2000 |

(Continued)

OTHER PUBLICATIONS

Notice of Rejection issued by the Japanese Patent Office on Sep. 24, 2013, for Japanese Patent Application No. 2010-145886, and English-language translation thereof.

(Continued)

*Primary Examiner* — Duy Deo
(74) *Attorney, Agent, or Firm* — Finnegan, Henderson, Farabow, Garrett & Dunner, L.L.P.

(57) ABSTRACT

According to an embodiment, a method of manufacturing a semiconductor device includes polishing a peripheral portion of the semiconductor substrate, and forming a protective film to be an insulating film, on a surface of the semiconductor substrate including a surface exposed by the polishing.

7 Claims, 4 Drawing Sheets

(56) References Cited

FOREIGN PATENT DOCUMENTS

| | | |
|---|---|---|
| JP | 2004-55750 | 2/2004 |
| JP | 2007-96091 | 4/2007 |
| JP | 2007-214256 | 8/2007 |
| JP | 2007-305755 | 11/2007 |
| JP | 2009-99875 | 5/2009 |
| JP | 2009-224496 | 10/2009 |

OTHER PUBLICATIONS

Notice of Rejection issued by the Japanese Patent Office on Dec. 17, 2013, for Japanese Patent Application No. 2010-145886, and English-language translation thereof.

First Examination Opinion issued by the Taiwanese Patent Office on Aug. 29, 2013, for Taiwanese Patent Application No. 100119277, and English-language translation thereof.

* cited by examiner

METHOD OF MANUFACTURING SEMICONDUCTOR DEVICE, SEMICONDUCTOR DEVICE, AND CAMERA MODULE

CROSS-REFERENCE TO RELATED APPLICATIONS

This application is based upon and claims the benefit of priority from the prior Japanese Patent Application No. 2010-145886, filed on Jun. 28, 2010 the entire contents of which are incorporated herein by reference.

FIELD

Embodiments described herein relate generally to a method of manufacturing a semiconductor device, a semiconductor device, and a camera module.

BACKGROUND

The miniaturization and the high integration of a semiconductor element are accelerated. For this reason, generation of a minute foreign material and a defect that is caused by removing or chipping of a stacked film of an end portion of a substrate greatly affects a yield of the product. In order to decrease this influence, bevel polishing to polish the end portion of the substrate with a blade is generally performed.

However, if polishing such as the bevel polishing is performed, a metal such as copper or aluminum to form a circuit may be exposed from a polished portion, and the metal may be contaminated. In particular, in a back surface irradiation type complementary metal oxide semiconductor (CMOS) image sensor that attracts attention in recent years, after bonding two substrates of a device substrate having a copper or aluminum wire and a support substrate, a back surface of the device substrate is mechanically and chemically polished. For this reason, the contamination from the end portion of the substrate may spread over the entire substrate.

DETAILED DESCRIPTION

According to embodiments, a method of manufacturing a semiconductor substrate includes a polishing process of polishing a peripheral portion of a semiconductor substrate and a protective film forming process of forming a protective film to be an insulating film, on a surface of the semiconductor substrate including a surface exposed by the polishing process.

First Embodiment

Figure 1:
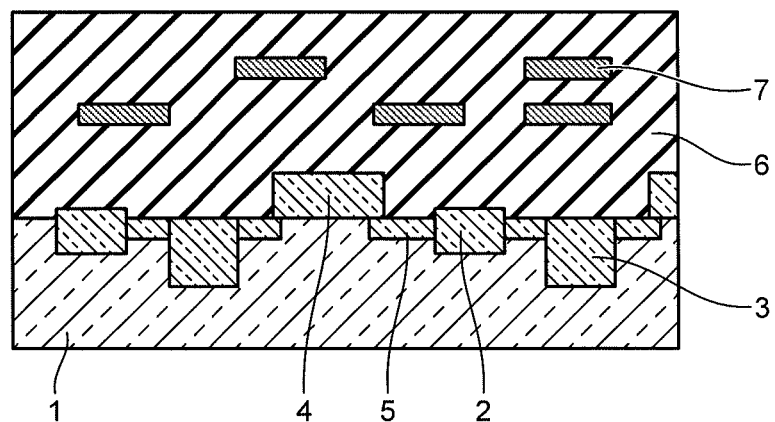
FIG. 1 is a cross-sectional view illustrating an example of a semiconductor substrate according to a first embodiment.

FIG. 1 is a cross-sectional view illustrating an example of a semiconductor substrate that becomes a processing object of a method of manufacturing a semiconductor substrate according to the first embodiment. As illustrated in FIG. 1, the semiconductor substrate according to this embodiment includes a silicon substrate 1, a semiconductor region 2, a light receiving element 3, a gate 4, a source/drain 5, an interlayer insulating film 6, and a wire 7. In the silicon substrate 1, a photodiode (not illustrated in the drawings) that functions as an image capturing element is formed.

The semiconductor substrate according to this embodiment may be manufactured using any method of manufacturing a semiconductor. For example, an opening is formed in the semiconductor substrate 1 using resist exposure and etching, the opening is filled with an insulating material such as a silicon oxide film or a silicon nitride film, using a chemical vapor deposition (CVD) method or a coating method, and a semiconductor region 2 is formed using a shallow trench isolation (STI) method. Then, the light receiving element 3, the gate 4, and the source/drain 5 are formed on the silicon substrate 1, deposition of the interlayer insulating film 6 and formation of the aluminum wire 7 are repeated thereon, and a multilayered wire is formed.

In FIG. 1, an example of the configuration of a semiconductor substrate used in a back surface irradiation type CMOS image sensor is illustrated as an example of the semiconductor substrate according to this embodiment. The semiconductor substrate according to this embodiment is not limited to the semiconductor substrate that has the configuration of FIG. 1, and may be a semiconductor substrate having any configuration. A semiconductor substrate that uses a substrate other than the silicon substrate may be used.

Figure 2A:
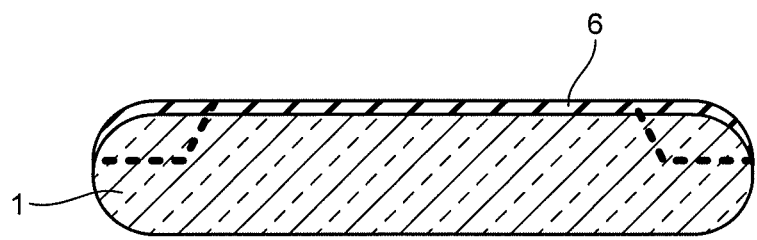
FIGS. 2A to 2C are diagram illustrating an example of a method of manufacturing a semiconductor substrate according to the first embodiment.
Figure 2B:
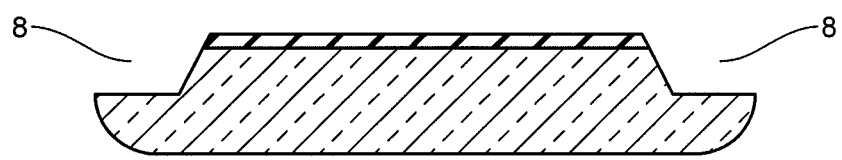
Figure 2C:
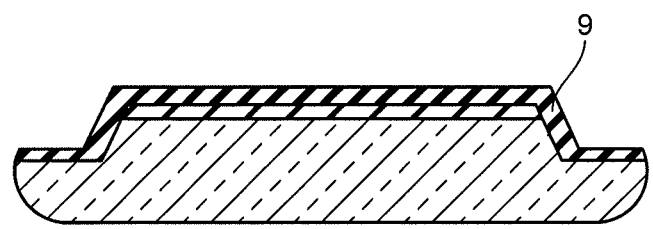

Next, a method of manufacturing a semiconductor substrate according to this embodiment will be described. FIGS. 2A to 2C are diagram illustrating an example of the method of manufacturing a semiconductor substrate according to this embodiment. In FIGS. 2A to 2C, minute portions (the semiconductor region 2, the light receiving element 3, the gate 4, the source/drain 5, and the wire 7) of the semiconductor substrate according to this embodiment are omitted, and the silicon substrate 1 and the interlayer insulating film 6 are illustrated.

First, trimming processing is performed using bevel polishing to polish a predetermined portion (portion shown by a dotted line in FIG. 2A) of a peripheral portion (end portion) of the semiconductor substrate illustrated in FIG. 2A, and an exposed surface 8 is formed as illustrated in FIG. 23. The exposed surface 8 is surfaces of the silicon substrate 1 and the interlayer insulating film 6 that is not exposed to the outside before the trimming processing and is exposed after the trimming processing. The wire 7 is also included in a layer that is illustrated as the interlayer insulating film 6 of FIG. 2B, and the wire 7 may be included in the exposed surface 8. A trimming processing method is not limited to the bevel polishing and may be implemented by any method. When the trimming processing is performed, a trimming shape is not limited to a shape illustrated in FIG. 2B and may be any shape.

Next, as illustrated in FIG. 2C, a protective film 9 is formed on a surface of the interlayer insulating film 6 of the semiconductor substrate including the exposed surface 8, using the CVD method or a spin coating method. As the protective film 9, an insulating film that is made of any material may be used. For example, when the CVD method is used, a $SiO_2$ film that uses silane or tetraethoxysilane (TEOS) as a material, a SiOC film that uses organic silane as a material, a $Si_3N_4$ film that uses silane and ammonia as a material, and a phosphorous silicon glass (PSG) film that uses phosphine as a material may be used as the protective film 9. When the spin coating method is used a spin on glass (SOG) film that uses silanol as a material, methyl silses quioxane (MSQ) that is an organic material, and a polyimide film may be used as the protective film 9. Also, the protective film may be formed by stacking films of two or more materials.

By forming the protective film 9, the contamination of metal of the semiconductor substrate can be prevented, even when the metal is exposed by the trimming processing. Even though heat treatment or chemical processing is executed thereafter, the semiconductor substrate can be protected. The thickness of the protective film 9 may be appropriately set according to the material thereof. However, when the $Si_3N_4$ film is used, if the thickness of about 50 nm or more is set, the semiconductor substrate can be protected, even though the heat treatment or the chemical processing is executed thereafter. If the $Si_3N_4$ film, the PSG film, or the polyimide film is used as the protective film 9, a passivation effect due to the protective film 9 can be expected, and the semiconductor substrate can be protected from external damages and ultraviolet rays.

When the semiconductor substrate is used independently without being bonded to another substrate, after the protective film 9 is formed, the semiconductor substrate is divided and a semiconductor element (semiconductor device) is formed.

Next, a process that is executed when the semiconductor substrate is bonded to the other substrate will be described. For example, the semiconductor substrate that is used in the back surface irradiation type CMOS image sensor is bonded to the other substrate (support substrate), after the process illustrated in FIGS. 2A to 2C. Therefore, after the protective film 9 is formed in the semiconductor substrate, an adhesive layer is formed on the protective film 9 using the CVD method or the spin coating method.

Figure 3A:
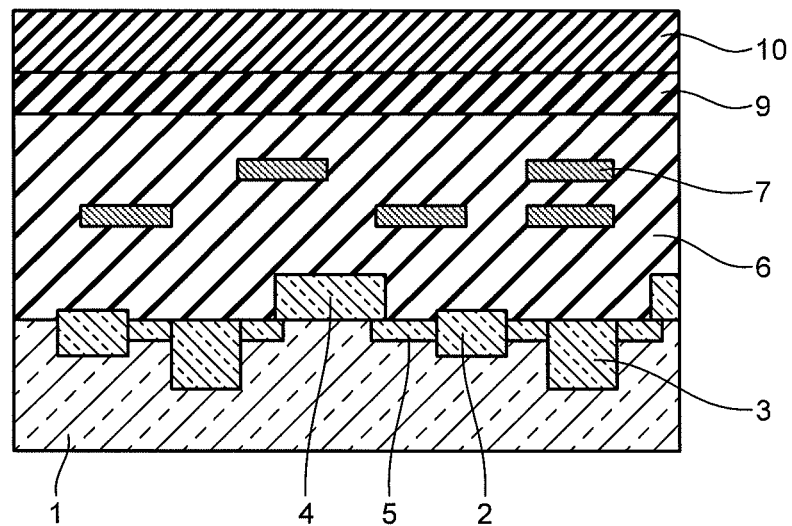
FIGS. 3A and 3B are cross-sectional views illustrating an example of the semiconductor substrate after a protective film is formed.
Figure 3B:
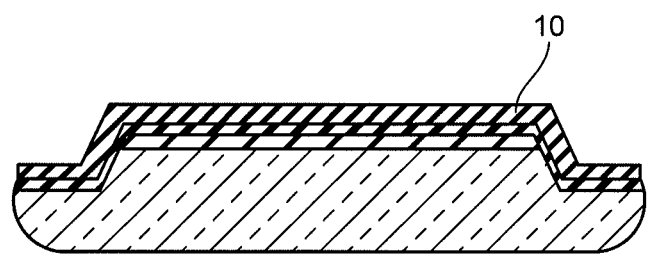

FIGS. 3A and 3B are cross-sectional views illustrating an example of the semiconductor substrate after the protective film 9 is formed. FIG. 3A is an enlarged view of the semiconductor substrate and FIG. 3B is a diagram illustrating the entire semiconductor substrate. In FIG. 3B, the minute portions (the semiconductor region 2, the light receiving element 3, the gate 4, the source/drain 5, and the wire 7) of the semiconductor substrate are omitted. As illustrated in FIG. 3B, by forming the adhesive layer 10 on the protective film 9, a semiconductor substrate that can be bonded to another substrate may be formed.

When the semiconductor substrate and another substrate are bonded using an adhesive material, an organic adhesive such as a urethane resin and an epoxy resin may be used as a material of the adhesive layer 10. When direct bonding is used, the $SiO_2$ film and the $Si_3N_4$ film may be used as the material of the adhesive layer 10. The thickness of the adhesive layer 10 may be appropriately set according to the material thereof. However, when the $SiO_2$ film using silane or tetraethoxysilane (TEOS) as a material is used, the thickness of the adhesive layer 10 is about 100 nm. Meanwhile, the thickness of the protective film 9 is about 50 nm, when the $Si_3N_4$ film using silane and ammonia as a material is used.

As such, in this embodiment, after the end portion of the semiconductor substrate is trimmed, the protective film 9 is formed on the surface of the interlayer insulating film 6 of the semiconductor substrate including the exposed surface 8. For this reason, the contamination of the end portion of the semiconductor substrate can be prevented.

Second Embodiment

Figure 4:
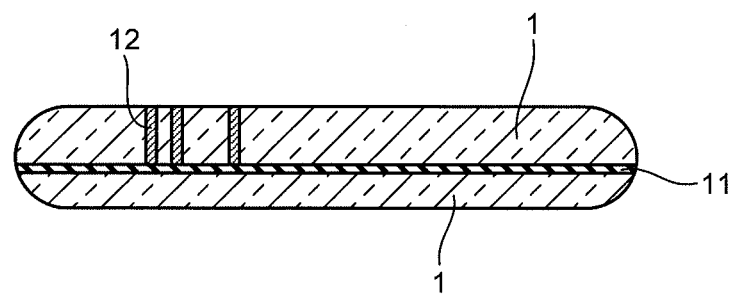
FIG. 4 is a cross-sectional view illustrating an example of a semiconductor substrate according to a second embodiment.

FIG. 4 is a cross-sectional view illustrating an example of a semiconductor substrate that becomes a processing object of a method of manufacturing a semiconductor device according to the second embodiment. As illustrated in FIG. 4, the semiconductor substrate according to this embodiment includes a silicon substrate 1, an interlayer insulating film 6, a stopper layer 11, and a conductor plug 12. The components that have the same functions as those of the first embodiment are denoted by the same reference numerals as those of the first embodiment and the detailed description thereof will not be repeated.

The configuration of the semiconductor substrate illustrated in FIG. 4 is an example of a semiconductor substrate that is used in a back surface irradiation type CMOS image sensor. In the vicinity of a boundary portion of the silicon substrate 1 and the interlayer insulating film 6 and in the interlayer insulating film 6, similar to the first embodiment, the semiconductor region 2, the light receiving element 3, the gate 4, the source/drain 5, and the wire 7 exist. However, these components are not illustrated in FIG. 4.

After the semiconductor substrate used in the back surface irradiation type CMOS image sensor is bonded to a support substrate, the semiconductor substrate is processed as a chip of the back surface irradiation type CMOS image sensor. The semiconductor substrate is preferably miniaturized to efficiently collect light incident on a back surface in a photodiode. In order to miniaturize the semiconductor substrate, a method that cuts the semiconductor substrate from the back surface after the semiconductor substrate is bonded to the support substrate is used. At this time, in order to cut the semiconductor substrate by chemical and mechanical polishing or chemical processing, the semiconductor substrate that has the stopper layer 11 is used. FIG. 4 is a diagram illustrating an example of the semiconductor substrate having the stopper layer 11.

As the semiconductor substrate having the stopper layer 11, for example, a silicon on insulator (SOI) substrate may be used. In the case of the SOI substrate, the stopper layer 11 is a silicon oxide layer. As the semiconductor substrate having the stopper layer 11, a substrate that is formed by doping boron, phosphorus, and arsenic in the silicon substrate 1 using an ion injection method may be used. In this case, a doping layer that is formed by doping becomes the stopper layer 11.

In the case of the semiconductor substrate used in the back surface irradiation type CMOS image sensor, before stacking the interlayer insulating film 6, the conductor plug 12 that passes through a portion from the surface of the silicon substrate 1 to the stopper layer 11 is formed in the silicon substrate 1. The conductor plug 12 is a plug to electrically connect the back surface and the front surface thereof.

Figure 5A:
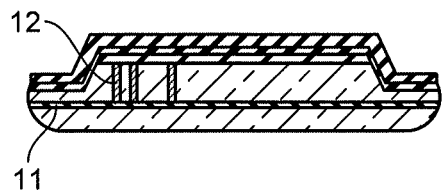
FIGS. 5A to 5F are diagrams illustrating an example of a method of manufacturing a semiconductor device according to the second embodiment.

FIGS. 5A to 5F are diagrams illustrating an example of a method of manufacturing a semiconductor device according to this embodiment. First, similar to the first embodiment, with respect to the semiconductor substrate having the stopper layer 11 illustrated in FIG. 4, the trimming processing is performed and the protective layer 9 and the adhesive layer 10 are formed. FIG. 5A is a diagram illustrating an example of the semiconductor substrate after the adhesive layer 10 is formed.

Figure 5B:
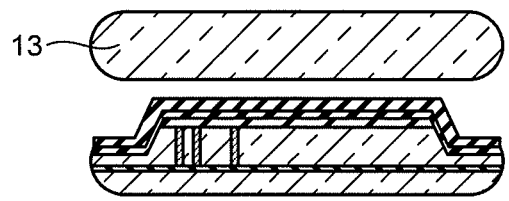
Figure 5C:
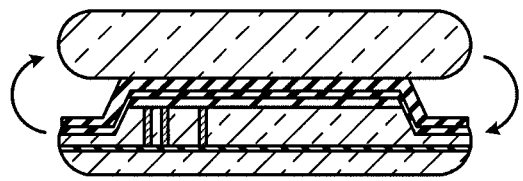
Figure 5D:
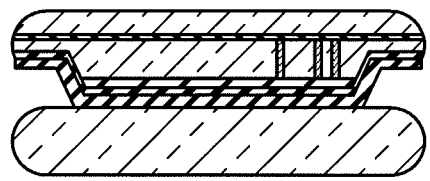

Next, as illustrated in FIG. 5B, a stacked substrate is formed by bonding the support substrate 13 to the semiconductor substrate from the side of the adhesive layer 10. As illustrated in FIG. 5C, the stacked substrate is reversed such that the back surface of the semiconductor substrate becomes the upper side as illustrated in FIG. 5D.

Figure 5E:
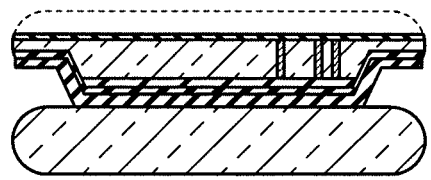

Next, as illustrated in FIG. 5E, the semiconductor substrate is miniaturized by performing the chemical and mechanical polishing or the chemical processing on the stacked substrate from the back surface of the semiconductor substrate and etching the silicon substrate 1 up to the stopper layer 11. In the chemical and mechanical polishing or the chemical processing, any polishing material or chemical solution may be used. When the $SiO_2$ film is used as the stopper layer 11, the chemical and mechanical polishing can be performed using a material having high selectivity.

Figure 5F:
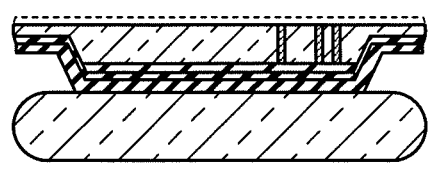

As illustrated in FIG. 5F, the stopper layer 11 is removed by the chemical processing. At this time, by forming the protective film 9 using a material resistant to the chemical solution, the interlayer insulating film 6 can be prevented from being etched by the chemical solution. For example, when a buffered hydrofluoric acid solution such as buffered hydrofluoric acid (BHF) and diluted hydrofluoric acid (DHF) is used as the chemical solution, if the $Si_3N_4$ film formed using the CVD method is used as the protective film 9, the interlayer insulating film 6 can be prevented from being etched.

Figure 6:
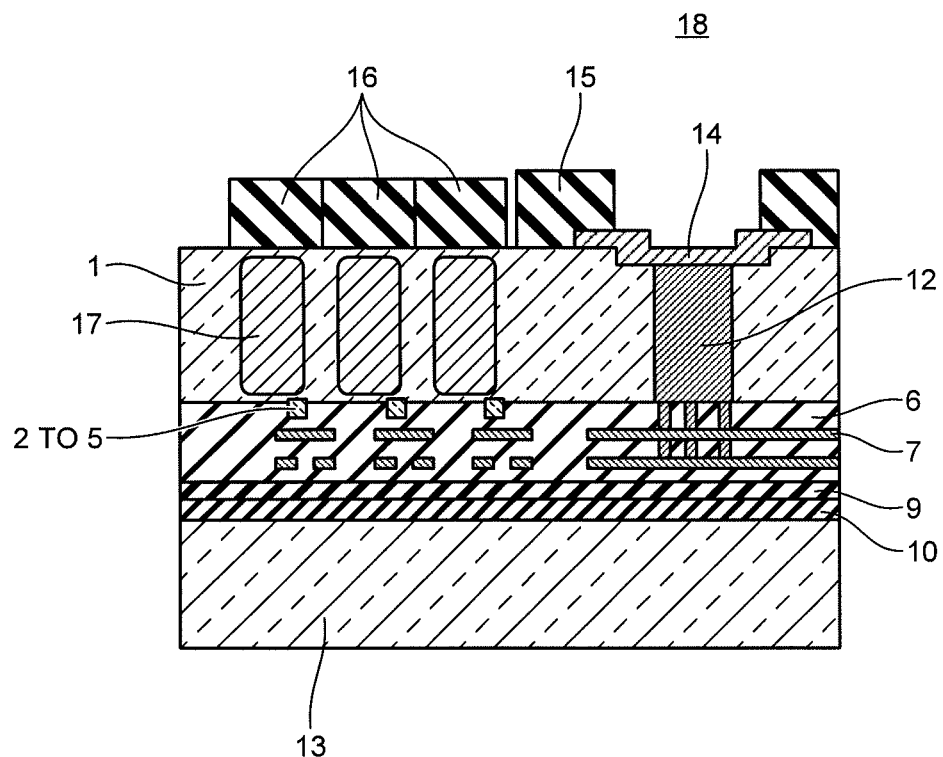
FIG. 6 is a cross-sectional view illustrating an example of a semiconductor element that is formed by the manufacturing method according to the second embodiment.

Then, by attaching a color filter to the stacked substrate and dividing the stacked substrate, a semiconductor element (semiconductor device) is formed. FIG. 6 is a cross-sectional view illustrating an example of the semiconductor element 18 that is formed by the manufacturing method according to this embodiment. In the example of FIG. 6, a pad 14 for solder, a passivation film 15, and a color filter 16 are formed on the back surface of the semiconductor substrate. In the silicon substrate 1, a photodiode 17 is formed.

Figure 7:
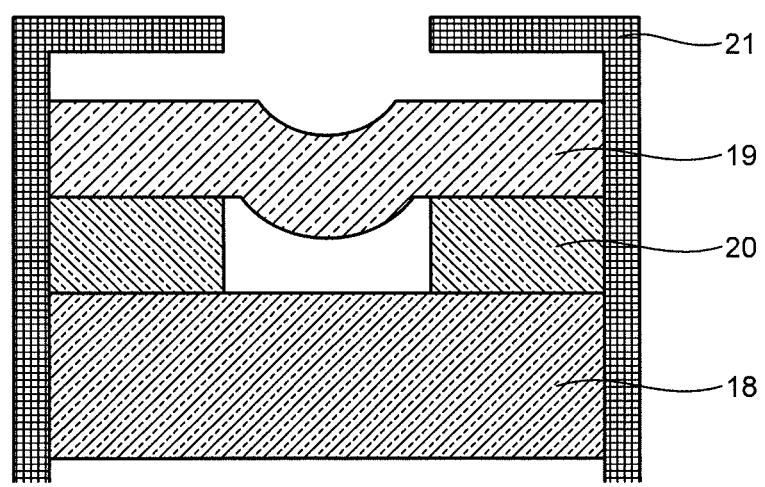
FIG. 7 is a diagram illustrating an example of the configuration of a back surface irradiation type CMOS image sensor that includes a semiconductor element according to this embodiment.

By combining the semiconductor element 18 formed in the above-described way with a lens module, the back surface irradiation type CMOS image sensor is formed. FIG. 7 is a diagram illustrating an example of the configuration of the back surface irradiation type CMOS image sensor that includes the semiconductor element 18 according to this embodiment. As illustrated in FIG. 7, the back surface irradiation type CMOS image sensor according to this embodiment includes the semiconductor element 18, a lens module 19, a spacer 20, and a shield cap 21. The semiconductor element 18 converts light condensed by the lens module 19 into an electric signal by a photoelectric conversion and outputs the electric signal. The configuration illustrated in FIG. 7 is exemplary. Therefore, the configuration of the back surface irradiation type CMOS image sensor using the semiconductor element 18 is not limited to the configuration illustrated in FIG. 7 and may be any configuration.

As such, in this embodiment, when the substrate having the stopper layer 11 is used as the semiconductor substrate, the semiconductor substrate is trimmed and the protective film 9 is formed on the surface of the interlayer insulating film 6 of the semiconductor substrate including the exposed surface 8. As a result, the same effect as that of the first embodiment can be obtained, and the interlayer insulating film 6 can be prevented from being etched when the chemical processing to remove the stopper layer 11 is executed.

While certain embodiments have been described, these embodiments have been presented by way of example only, and are not intended to limit the scope of the inventions. Indeed, the novel embodiments described herein may be embodied in a variety of other forms furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor substrate, comprising:
   polishing a peripheral portion of the semiconductor substrate; and
   forming a protective film to be an insulating film, on a surface of the semiconductor substrate including a surface exposed by the polishing,
   wherein the semiconductor substrate has a stopper layer that functions as an etching stopper layer,
   another substrate is bonded to the semiconductor substrate where the protective film is formed, from the side of the protective film, and a stacked substrate is formed,
   etching is performed from the side of the semiconductor substrate of the stacked substrate, using the stopper layer as the etching stopper layer, and the semiconductor substrate is miniaturized,
   the stopper layer is removed using a chemical solution, and
   the protective film is formed of a material resistant to the chemical solution.

2. The method of claim 1,
   wherein the semiconductor substrate is formed of an SOI substrate and the stopper layer is formed of a silicon oxide film.

3. The method of claim 1,
   wherein the semiconductor substrate has a doping layer formed by an ion injection method and the stopper layer is formed of the doping layer.

4. The method of claim 1,
   wherein the protective film is formed using a CVD method.

5. The method of claim 4,
   wherein the protective film is formed of one or more of a $SiO_2$ film, a SiOC film, a $Si_3N_4$ film, and a PSG film.

6. The method of claim 1,
   wherein the protective film is formed using a spin coating method.

7. The method of claim 6,
   wherein the protective film is formed of one or more of a SOG film, MSQ, and a polyimide film.

* * * * *